(12) United States Patent
Wang (10) Patent No.: US 10,656,954 B2
(45) Date of Patent: May 19, 2020

(54) INFORMATION PROCESSING APPARATUS, ACTIVATION METHOD OF INFORMATION PROCESSING APPARATUS, AND STORAGE MEDIUM

(71) Applicant: CANON KABUSHIKI KAISHA, Tokyo (JP)

(72) Inventor: Xiaoli Wang, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 132 days.

(21) Appl. No.: 15/802,970

(22) Filed: Nov. 3, 2017

(65) Prior Publication Data
US 2018/0129508 A1 May 10, 2018

(30) Foreign Application Priority Data

Nov. 10, 2016 (JP) ................................. 2016-219733

(51) Int. Cl.
| | |
|---|---|
| *G06F 9/44* | (2018.01) |
| *G06F 9/4401* | (2018.01) |
| *H04N 1/00* | (2006.01) |
| *G06F 1/3234* | (2019.01) |
| *G06F 3/06* | (2006.01) |
| *G11C 11/406* | (2006.01) |
| *G06F 8/61* | (2018.01) |

(52) U.S. Cl.
CPC .......... *G06F 9/4418* (2013.01); *G06F 1/3234* (2013.01); *G06F 3/0625* (2013.01); *G06F 3/0647* (2013.01); *G06F 3/0673* (2013.01); *G11C 11/40615* (2013.01); *H04N 1/00891* (2013.01); *G06F 8/63* (2013.01); *Y02D 10/42* (2018.01); *Y02D 10/44* (2018.01)

(58) Field of Classification Search
CPC ................. G06F 1/32; G06F 1/26; G06F 1/28
See application file for complete search history.

(56) References Cited

U.S. PATENT DOCUMENTS

| | | | | |
|---|---|---|---|---|
| 2012/0284550 A1* | 11/2012 | Park | ................... | H04N 1/00885 713/323 |
| 2015/0106564 A1* | 4/2015 | Kopylovitz | .......... | G06F 12/0866 711/114 |
| 2015/0286823 A1* | 10/2015 | Elnekaveh | ............. | G06F 21/575 713/2 |
| 2016/0062775 A1* | 3/2016 | Yoshihara | .............. | G06F 9/4418 |

FOREIGN PATENT DOCUMENTS

JP     2016051925 A     4/2016

* cited by examiner

*Primary Examiner* — Jaweed A Abbaszadeh
*Assistant Examiner* — Keshab R Pandey
(74) *Attorney, Agent, or Firm* — Venable LLP (57) ABSTRACT

An information processing apparatus of the invention includes a main system and a sub system, and executes activation processing on the basis of a boot image. The information processing apparatus includes: a saving unit configured to save the boot image which is developed in a first area of a storage unit in the sub system, in a second area which is different from the first area in the storage unit, in the activation processing of the sub system, in a case where the information processing apparatus is activated from a power off state; a restoration unit configured to restore the boot image which is saved in the second area to the first area in a case where the information processing apparatus is transitioned to a power saving state from a normal power state; and a holding unit configured to hold the restored boot image.

8 Claims, 9 Drawing Sheets

INFORMATION PROCESSING APPARATUS, ACTIVATION METHOD OF INFORMATION PROCESSING APPARATUS, AND STORAGE MEDIUM

BACKGROUND OF THE INVENTION

Field of the Invention

The present invention relates to an information processing apparatus including a main system and a sub system, and an activation method of the information processing apparatus.

Description of the Related Art

A multi function peripheral (hereinafter, referred to as an "MFP") having a print function, a scanner function, a FAX function, and the like is known as an information processing apparatus including a main system and a sub system. In such an MFP, a normal power state in which power is supplied to a main module, such as a print device, a scanner device, and a FAX device, and a power saving state in which the MFP is operated at low consumption power lower than the normal power state can be switched.

However, according to the standard of the FAX device, it is required to complete a response within 6 seconds to an incoming FAX from the other FAX device. For this reason, when the MFP is returned to the normal power state from the power saving state, it is necessary for the MFP to ensure responsiveness by rapidly activating the sub system which controls the FAX device and the like.

A method of Japanese Patent Laid-Open No. 2016-051925 is disclosed as a method of rapidly activating the sub system. When an MFP of Japanese Patent Laid-Open No. 2016-051925 is transitioned to a power saving state from a normal power state, the MFP may hold a boot image required for activating the sub system in a DRAM in advance. When the MFP of Japanese Patent Laid-Open No. 2016-051925 is transitioned to the normal power state from the power saving state, it is possible to rapidly activate the sub system by using the boot image held in the DRAM.

SUMMARY OF THE INVENTION

An object of the invention is to improve responsiveness in an information processing apparatus including a main system and a sub system.

There is provided an information processing apparatus of the invention which includes a main system and a sub system, and executes activation processing of the sub system on the basis of a boot image transmitted from the main system, the information processing apparatus including: a saving unit configured to save the boot image which is developed in a first area of a storage unit in the sub system, in a second area which is different from the first area in the storage unit, in the activation processing of the sub system, in a case where the information processing apparatus is activated from a power off state; a restoration unit configured to restore the boot image which is saved in the second area to the first area, in a case where the information processing apparatus is transitioned to a power saving state from a normal power state; and a holding unit configured to hold the restored boot image.

Further features of the present invention will becomes apparent from the following description of exemplary embodiments with reference to the attached drawings.

DESCRIPTION OF THE EMBODIMENTS

In the MFP to which the method of Japanese Patent Laid-Open. No. 2016-051925 is applied, there is a case where the activation of the sub system can not be completed within a time limit required for the standard. This is because negotiation is required between the main system and the sub system, and thus, there is a case where delay time for waiting for the processing of the main system occurs in the activation processing of the sub system. That is, in the MFP of the related art, responsiveness is degraded.

Hereinafter, an embodiment of the invention will be described with reference to the drawings. Here, components described in the embodiment are merely an example, and the scope of the invention is not limited thereto.

<System Configuration>

Figure 1:
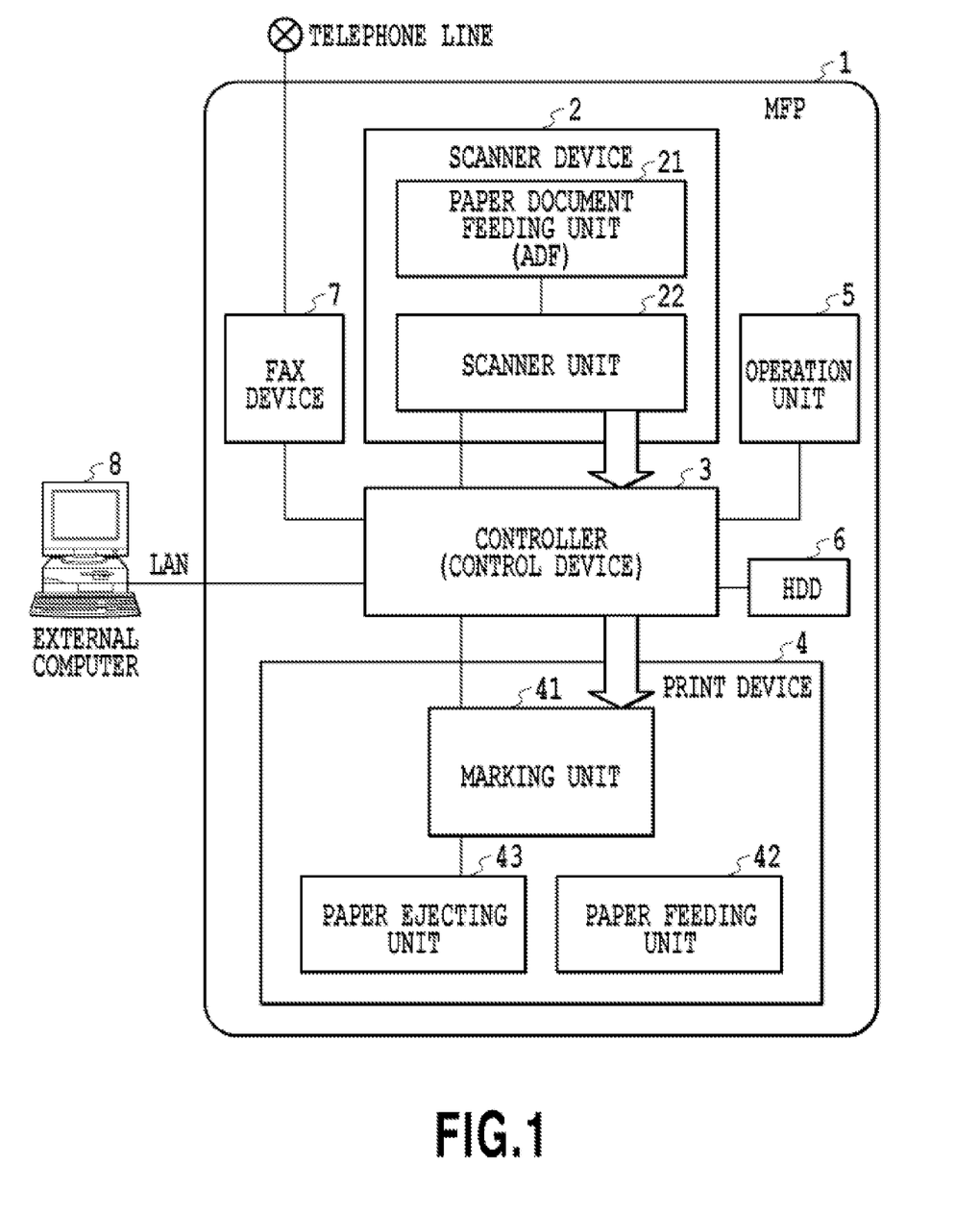
FIG. 1 is a block diagram illustrating a configuration of an MFP according to an embodiment.

FIG. 1 is a block diagram illustrating a configuration of an MFP 1, which is an example of an information processing apparatus in the present embodiment. The MFP 1 is configured of a scanner device 2, a controller (a control device) 3, a print device 4, an operation unit 5, an HDD 6, and a FAX device 7. The scanner device 2 optically reads a paper document and converts the document into image data. The scanner device 2 includes a paper document feeding unit 21 (an auto document feeder) which may automatically supply a paper document bundle, and a scanner unit 22 which may optically read the paper document and of converting the document to the image data. The image data output from the scanner unit 22 is transmitted to the controller 3. The controller 3 integrally controls each apparatus (each module) of the MFP 1, and allows a received job to be executed in each of the devices of the MFP 1. The print device 4 outputs the image data to a printing medium such as a sheet. The print device 4 includes a paper feeding unit 42 which may supply a sheet from a sheet bundle one by one, a marking unit 41 which prints the image data on the sheet supplied from the paper feeding unit 42, and a paper ejecting unit 43 ejecting sheet which is printed in the marking unit 41. The operation unit 5 is configured of a manipulation panel for receiving an operation of a user, and a display unit which displays various information items to the user. The display unit may be configured of a touch screen display which functions as a manipulation panel. The HDD 6 is a hard disk drive and is a storage device which stores the image data, a control program, and the like. In the present embodiment, the HDD 6 is exemplified as the storage device, but insofar as the storage device may store the image data, the control program, and the like, the storage device may be other storage devices such as a solid state drive (SSD). The FAX device 7 transmits and receives the image data to the other FAX device through a telephone line. The MFP 1 of present embodiment is connected to an external computer 8 to communicate with each other through a LAN. The external computer 8 may transmit various jobs for operating the MFP 1 and various commands for controlling the MFP 1. In the present embodiment, the MFP 1 executes processing of transitioning the MFP 1 to a power off state as a power switch (not illustrated) is turned OFF or as a shutdown command is received from the external computer 8. In addition, the MFP 1 executes processing of transitioning the MFP 1 to a power saving state as the power-saving switch (not illustrated) of the operation unit 5 is turned ON or as a command for instructing the MFP to be transitioned to the power saving state is received from the external computer 8.

The MFP 1 of present embodiment has a scan function, a copy function, a printing function, and the like. As described above, the scan function is a function of optically reading the paper document and of converting the document into the image data. The copy function is a function of saving the image data read in the scanner device 2 in the HDD 6 and of performing printing in the print device 4. The printing function is a function of analyzing PDL data which is transmitted from the external computer 8 and is described in a page description language, and of printing image data (bitmap data) which is generated on the basis of the analysis of the PDL data in the print device 4. In addition, the MFP 1 of the present embodiment also has an image transmitting function of transmitting the image data read in the scanner device 2 to the external computer 8, an image saving function of reading out the image data which is saved once in the HDD 6, transmitting the image data to the external computer 8, and printing the image data in the print device 4.

Figure 2:
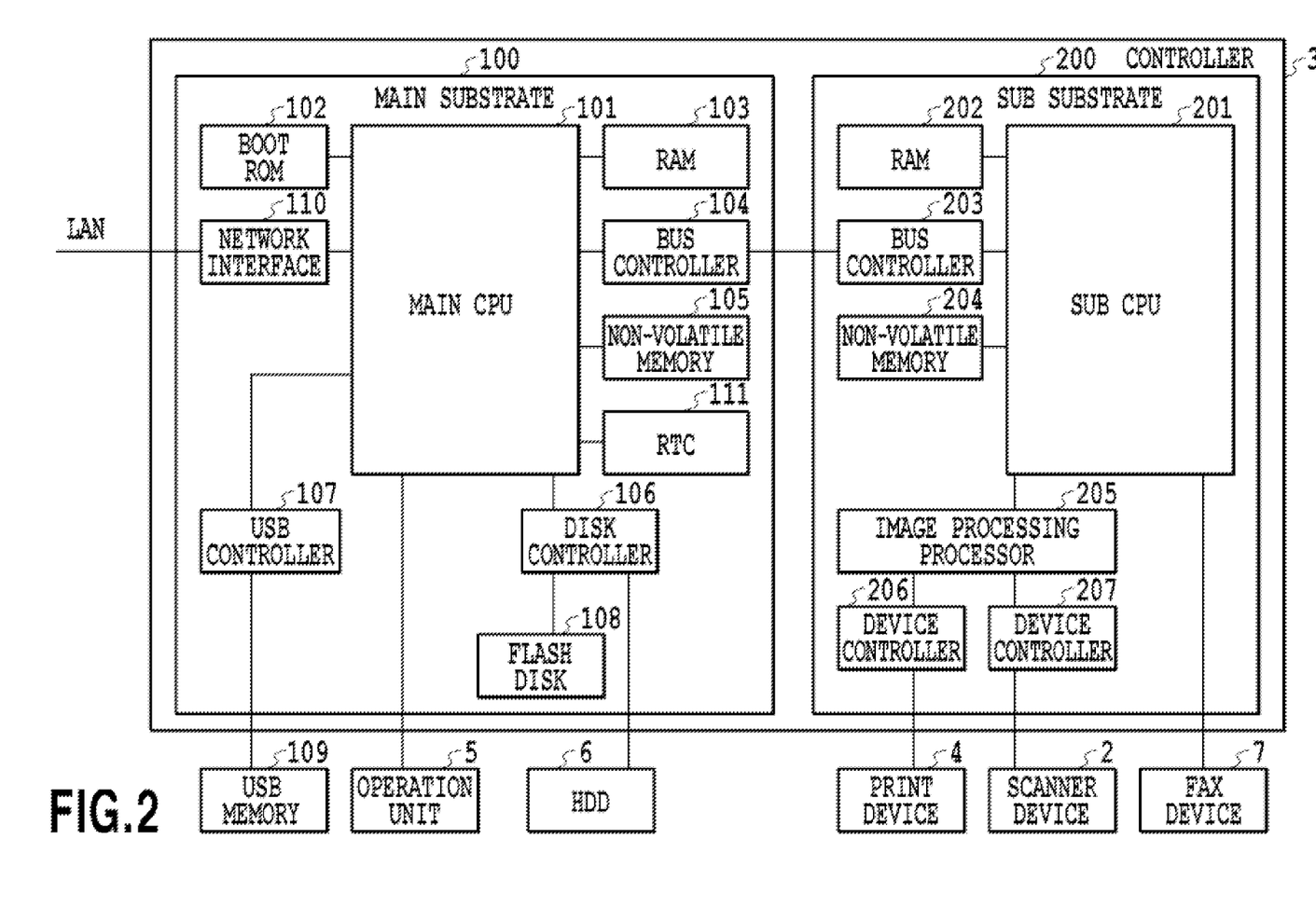
FIG. 2 is a block diagram illustrating a configuration of a controller according to the embodiment.

FIG. 2 is a block diagram illustrating a configuration of a controller according to present embodiment. The controller 3 of present embodiment is configured of a main substrate 100, a sub substrate 200, and a sub device. The main substrate 100 and the sub substrate 200 respectively correspond to a main system and a sub system.

The main substrate 100 is a so-called general-purpose CPU system. The main substrate 100 is mainly configured of a main CPU 101 which controls the entire main substrata 100, a boot ROM 102 in which a program for activation is stored, and an RAM 103 which is used by the main CPU 101 as a work area. A bus controller 104 has a bridge function to an external bus of the main substrate 100. A non-volatile memory 105 is a storage area in which the saved data is not eliminated even in the power off state where the power source is not supplied. Further, the main substrate 100 includes a disk controller 106 and a USB controller 107. The disk controller 106 controls a storage device such as a flash disk 108 which is configured of a semiconductor device and has comparatively small capacitance, in addition to the HDD 6. The main substrate 100, the HDD 6, and an external device such as a USB memory 109, are connected to each other through such interfaces. Further, a network interface 110 performing communication through a network such as the external computer 8 and a real-time clock (RTC) 111 holding time information are connected to the main CPU 101.

The sub substrate 200 is a general-purpose CPU system which is smaller than the main substrate 100, and has a more simplified configuration. The sub substrate 200 is mainly configured of a sub CPU 201 which controls the entire sub substrate 200, and an RAM 202 which is used by the sub CPU 201 as a work area. A bus controller 203 has a bridge function to the external bus. A non-volatile memory 204 is a storage area in which the held data is not eliminated even in the power off state where the power source is not supplied. An image processing processor 205 is a processor specified for image processing, and performs the image processing of the input image data. The image processing processor 205 delivers the image data to the print device 4 through a device controller 206. Similarly, the image processing processor 205 delivers the image data to the scanner device 2 through a device controller 207. The FAX device 7 is directly controlled by the sub CPU 201 without using a device controller. In the present embodiment, the print device 4, the scanner device 2, and the FAX device 7, which are connected to the sub substrate 200, respectively correspond to the sub device.

The block diagram of the controller 3 illustrated in FIG. 2 and peripherals are simplified. For example, the male CPU 101, the sub CPU 201, and the like actually include a plurality of peripheral hardwares such as a chipset, a bus bridge, and a clock generator, but these are simplified in FIG. 2. However, the configuration illustrated by the block diagram of FIG. 2 does not limit the scope of the invention.

Here, a specific operation of the controller 3 in the present embodiment will be described by using an example in which the print device 4 copies to a sheet. In a case where the operation unit 5 receives a copy instruction from the user, the main CPU 101 of the main substrate 100 transmits a read command to the scanner device 2 through the sub CPU 201 of the sub substrate 200. The scanner device 2 optically scans the paper document and converts the document to the image data. The scanner device 2 inputs the converted image data into the image processing processor 205 through the device controller 207. The image processing processor 205 transmits the image data to the RAM 202 through the sub CPU 201, and temporarily saves the image data.

In a case where it is confirmed that a constant amount of the image data or the entire image data is transmitted to the RAM 202, the main CPU 101 performs an output instruction to print device 4 through the sub CPU 201. In a case where the output instruction is received, the sub CPU 201 transmits an address in the RAM 202 in which the image data is stored, to the image processing processor 205. The image data on the RAM 202 is transmitted to the print device 4 through the device controller 206 according to a synchronization signal from the print device 4. Then, the print device 4 prints the received image data on a sheet. Furthermore, in a case where the print device 4 prints a plurality of sheets of the same image data, the main CPU 101 may save the image data of the RAM 202 in the HDD 6. In this case, the main CPU 101 of the main substrate 100 may transmit the image data to the print device 4 in the printing of the second sheet and the subsequent sheets, without using the scanner device 2.

Figure 3:
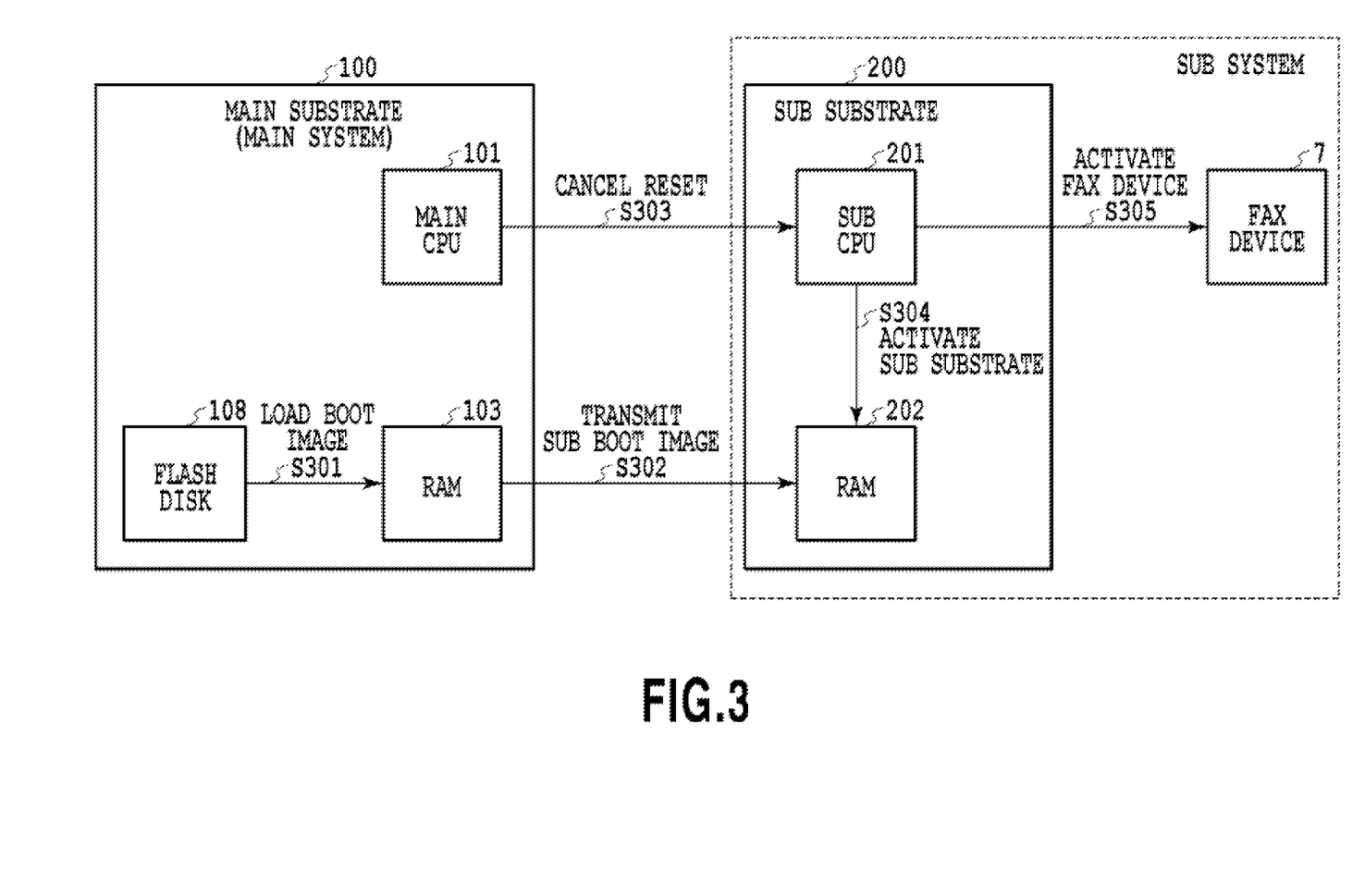
FIG. 3 is a block diagram illustrating an activation sequence of the MFP according to the embodiment.

FIG. 3 is a block diagram illustrating an activation sequence of the MFP 1 according to present embodiment. In the block diagram of FIG. 3, as with FIG. 2, the block diagram of the controller 3 and the peripherals are simplified, but it does not limit the scope of the invention. In the present embodiment, the MFP 1, for example, is activated from the power off state in which the power source is not supplied, as the power switch (not illustrated) is turned ON. In a case where the activation is completed, the MFP 1 is transitioned to a normal power stats in which the job can be executed. Hereinafter, an activation sequence in which the MFP 1 is transitioned to the normal power state from the power off state will be described with reference to FIG. 3. Furthermore, hereinafter, the embodiment is described in which the sub device is the FAX device 7, but the activation sequence of the MFP 1 is the same even in a case where the sub device is the scanner device 2 or the print device 4. A symbol of S described below indicates a step in a block diagram (or a flowchart) illustrating the activation sequence.

In a case where the MFP 1 is activated from the power off state, first, the main CPU 101 loads a boot image on the RAM 103 from the flash disk 108 by using a boot loader stored in the boot ROM 102 (S301). In the present embodiment, the boot image represents an image in which a program for activation required for the activation of the MFP 1 or various data items are collected, and a main boot image is used for the activation of the main substrate 100, and a sub boot image is used for the activation of the sub substrate 200.

Next, the main CPU 101 reads out the sub boot image from the RAM 103, and transmits the sub boot image to the RAM 202 of the sub substrate 200 (S302). In addition, the main CPU 101 develops the main boot image which is read out from the RAM 103, and starts the activation processing of the main substrate 100. Next, the main CPU 101 switches a reset signal which is input into the sub CPU 201 to be OFF, and cancels the reset of the sub CPU 201 (S303). The sub CPU 201 develops the sub boot image which is read out from the RAM 202, as the reset is cancelled, and starts the activation processing of the sub substrate 200 (S304). Next, in a case where the activation of the sub substrate 200 is completed or the activation of the sub substrate 200 is completed up to a predetermined stage, the sub CPU 201 starts the activation processing of the FAX device 7. In a case where the activation processing of the FAX device 7 is completed, the FAX device 7 may response to the incoming FAX from the other FAX device which is connected to the FAX device 7 through a telephone line.

Figure 4:
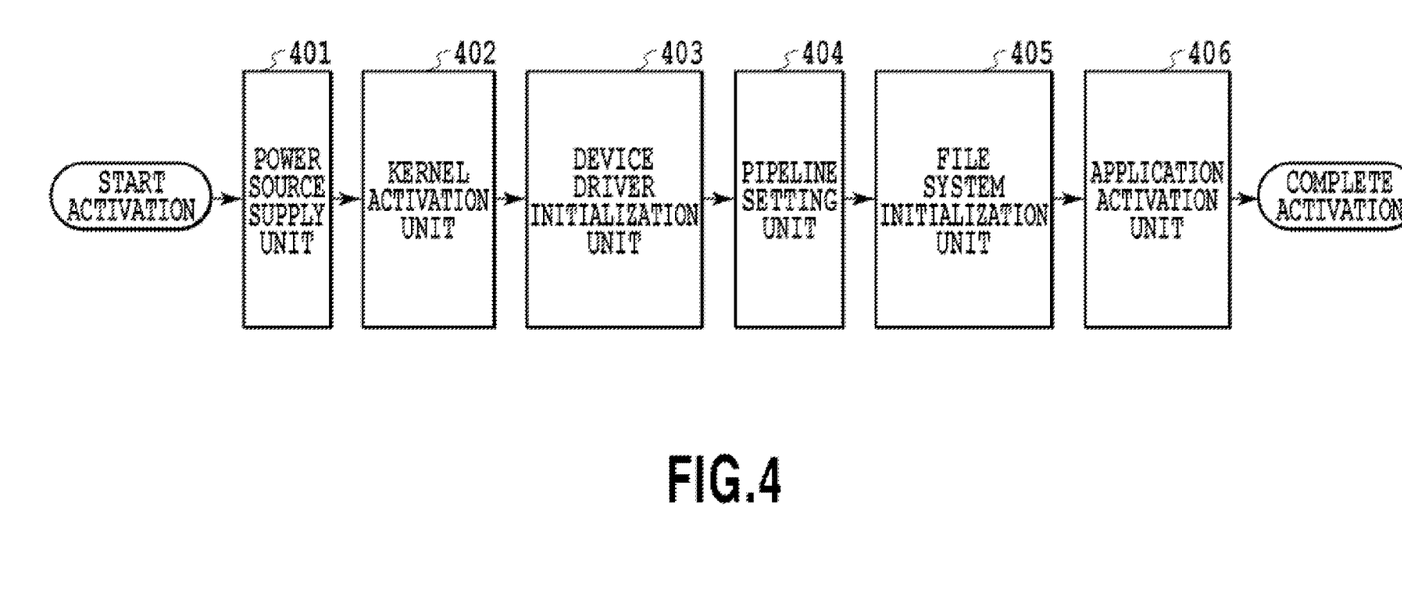
FIG. 4 is a functional block diagram illustrating activation processing of a sub substrate according to the embodiment.

FIG. 4 is a functional block diagram illustrating the activation processing of the sub substrate 200 in the present embodiment. Each functional block illustrated in FIG. 4 is realized by executing a program for activation and an application program which are developed from the sub boot image by the sub CPU 201.

A power source supply unit 401 supplies the power source to the sub substrate 200 as the power switch (not illustrated) is turned ON.

A kernel activation unit 402 activates a kernel, which is a core portion of an operating system (hereinafter, referred to as an "OS") operated in the sub CPU 201. The kernel manages a hardware resource such as the sub CPU 201 or the RAM 202, and manages an execution state of the program during the operation. In the present embodiment, the OS operated in the sub CPU 201 is developed from the sub boot image as with the program for activation.

A device driver initialization unit 403 initializes each device driver corresponding to each apparatus (for example, the main substrate 100, the FAX device 7, and the like) which may access the sub CFU 201. For example, an input/output (I/O) port, a timer, or the like of each of the apparatuses, is initialized by the device driver initialization unit 403.

A pipeline setting unit 404 sets a pipeline which is a virtual communication path between the sub CPU 201 and the main CPU 101, by using the initialized device driver. As it is known in the technical field of the software, in a so-called software hierarchy, it is difficult for a device driver classified into a low hierarchy to be operated from an application classified into a high hierarchy. For this reason, the pipeline setting unit 404 sets the pipeline which is the virtual communication path between the devices, and thus, provides a communication interface in which an application can be easily operated.

A file system initialization unit 405 initializes a file system of the OS which is operated in the sub CPU 201. In addition, a data transmit mechanism such as a direct memory access (hereinafter, referred to as a "DMA") is also initialized as the file system is initialized. Furthermore, the DMA represents a data transmit mechanism in which data is directly transmitted between a memory and a memory or between a memory and an I/O port. For example, the sub CPU 201 may transmit data to the RAM 103 of the main substrate 100 through the bus controllers 104 and 203, without using the main CPU 101.

An application activation unit 406 activates an application operated in the sub CPU 201. In the present embodiment, the application operated in the sub CPU 201 is developed from the sub boot image as with the OS. In a case where the application activation unit 406 completes the activation of the application for controlling the FAX device 7, the FAX device 7 may perform the response to the incoming FAX from the other FAX device which is connected to the FAX device 7 through a telephone line.

Figure 5:
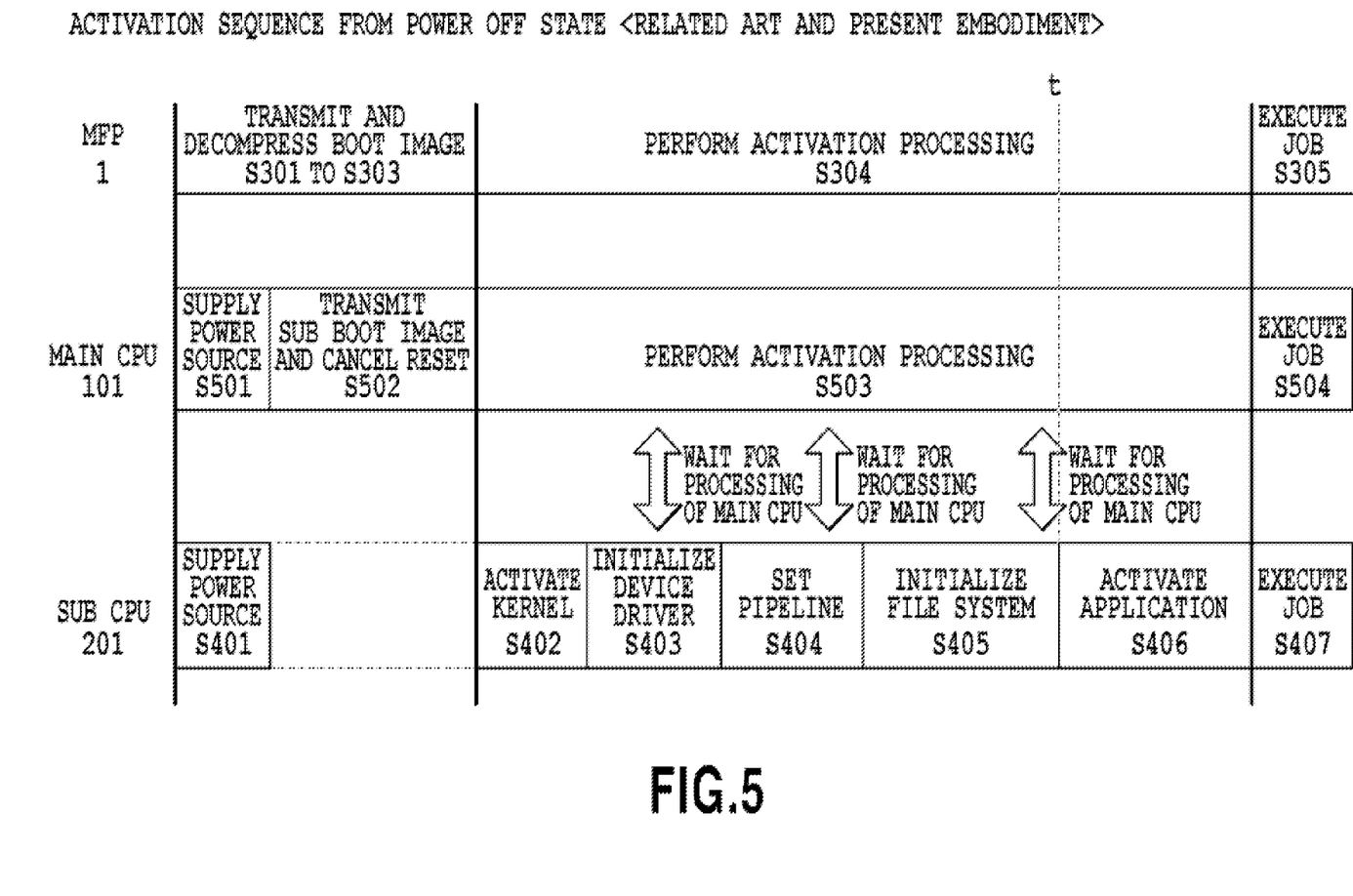
FIG. 5 is a timing chart illustrating an activation sequence in which the MFP according to present embodiment is activated from a power off state.

FIG. 5 is a timing chart illustrating an activation sequence in which the MFP 1 according to the related art and present embodiment is activated from the power off state. In the timing chart of FIG. 5, S301 to S305 representing the activation sequence of the MFP 1 respectively correspond to the processing described in the block diagram of FIG. 3. In addition., in the timing chart of FIG. 5, S401 to S406 representing the activation sequence of the sub CPO 201 respectively correspond to the functional block described in the functional block diagram of FIG. 4. The same applies to the following drawings.

First, the activation sequence of the main substrate 100 will be described. In S501, the power source is supplied to the main substrate 100. In S502, the main CPU 101 transmits the sub boot image which is read out from the flash disk 108 to the RAM 202, and cancels the reset of the sub CPU 201. In S503, the main CPU 101 develops the main boot image, and starts the execution of the program for activation. The main CPU 101 executes the activation processing by using the program for activation and various data items while performing negotiation with the sub CPU 201 at a suitable timing. Furthermore, the negotiation of present embodiment represents the transmission and the reception of data executed between the main substrate 100 and the sub substrate 200 is transmitted and received, in the activation processing (S503) of the main substrate 100 and the activation processing (S402 to S406) of the sub substrate 200. More specifically, the negotiation of present embodiment includes the transmission and the reception of data for confirming the communication of communication path between the main CPU 101 and the sub CPU 201, the transmission and the reception of data required for the activation processing (S406) of the application operated in the sub CPU 201, or the like.

Next, the activation sequence of the sub substrate 200 will be described. In S401, the power source is supplied to the sub substrate 200. In S402, the sub CPU 201 develops the sub boot image which is transmitted from the main CPU 101, and starts the execution of the program for activation of the sub substrate 200. At this time, the kernel activation unit 402 activates the kernel of the OS operated in the sub CPU 201. As described above, the OS operated in the sub CPU 201 is developed from the sub boot image as with the program for activation.

In S403, the device driver initialization unit 403 initializes a device driver corresponding to each of the apparatuses (for example, the main CPU 101, the FAX device 7, and the like) which may access the sub CPU 201. In a case where the initialization of the device driver is completed, the device driver initialization unit 403 transmits an ACK request to each of the apparatuses in order to confirm whether or not the communication path at a device driver level is established. For example, in a case where an ACK response is received from the main substrate 100, the device driver initialization unit 403 may confirm that the communication path at the device driver level is established, between the sub CPU 201 and the main CPU 101.

In S404, the pipeline setting unit 404 sets the pipeline which is the virtual communication path between the sub CPU 201 and the main CPU 101 by using the initialized device driver. In a case where the setting of the pipeline is completed, the pipeline setting unit 404 transmits an ACK request to the main CPU 101 in order to confirm whether or not the communication path is established through the pipeline. In a case where an ACK response is received from the main CPU 101, the pipeline setting unit 404 may confirm that the communication path is established through the pipeline, between the sub CPU 201 and the main CPU 101.

In S405, the file system initialization unit 405 initializes the file system of the OS operated in the sub substrate 200. In addition, the data transmit mechanism such as the DMA is also initialized as the file system is initialized. In the present embodiment, in a case where the initialization of the file system or the like is completed, information required for activating the application operated in the sub CPU 201 through the pipeline set in S404 is acquired from the main CPU 101.

Thus, in a process where the sub CPU 201 executes the activation processing, the negotiation is performed between the sub CPU 201 and the main CPU 101. However, the main substrate 100 has more components or functions than the sub substrate 200, and thus, time required for activating the main substrate 100 is longer than time required for activating the sub substrate 200. For this reason, there is a case where a timing at which various information items are transmitted to the sub CPU 201 from the main CPU 101 is delayed regardless of the activation processing of the main CPU 101. There is a case where such delay becomes longer according to the properties of the OS operated in the main CPU 101, spinup time of the HDD 6, or the like.

According to the standard of the FAX device, the FAX device 7 is required to have performance of completing the response to the incoming FAX from the other FAX device which is connected to the FAX device 7 through a telephone line within 6 seconds. In the FAX device 7 of present embodiment, processing time of approximately 3 seconds is required in order to complete the response to the other FAX device, and thus, it is desirable that time from the supply of the power source (S401) to the completion of the activation of the FAX device 7 (S406) is within 3 seconds. For this reason, in the activation of the sub substrate 200, in a case where time to wait for the activation processing of the main CPU 101 becomes longer, the FAX device 7 may not satisfy the performance which is required for the standard.

Furthermore, which one of the activation processing (S503) of the main CPU 101 and the application activation (S406) of the sub CPU 201 is completed first depends on the type of the MFP 1. In the present embodiment, for convenience of description, the activation processing (S503) of the main CPU 101 and the application activation (S406) of the sub CPU 201 are set to be ended at the same timing. The MFP 1 of present embodiment is in a state where the received job can not be executed at a time point when the activation processing (S503) of the main CPU 101 and the activation processing (S402 to S406) of the sub CPU 201 are ended.

Figure 6:
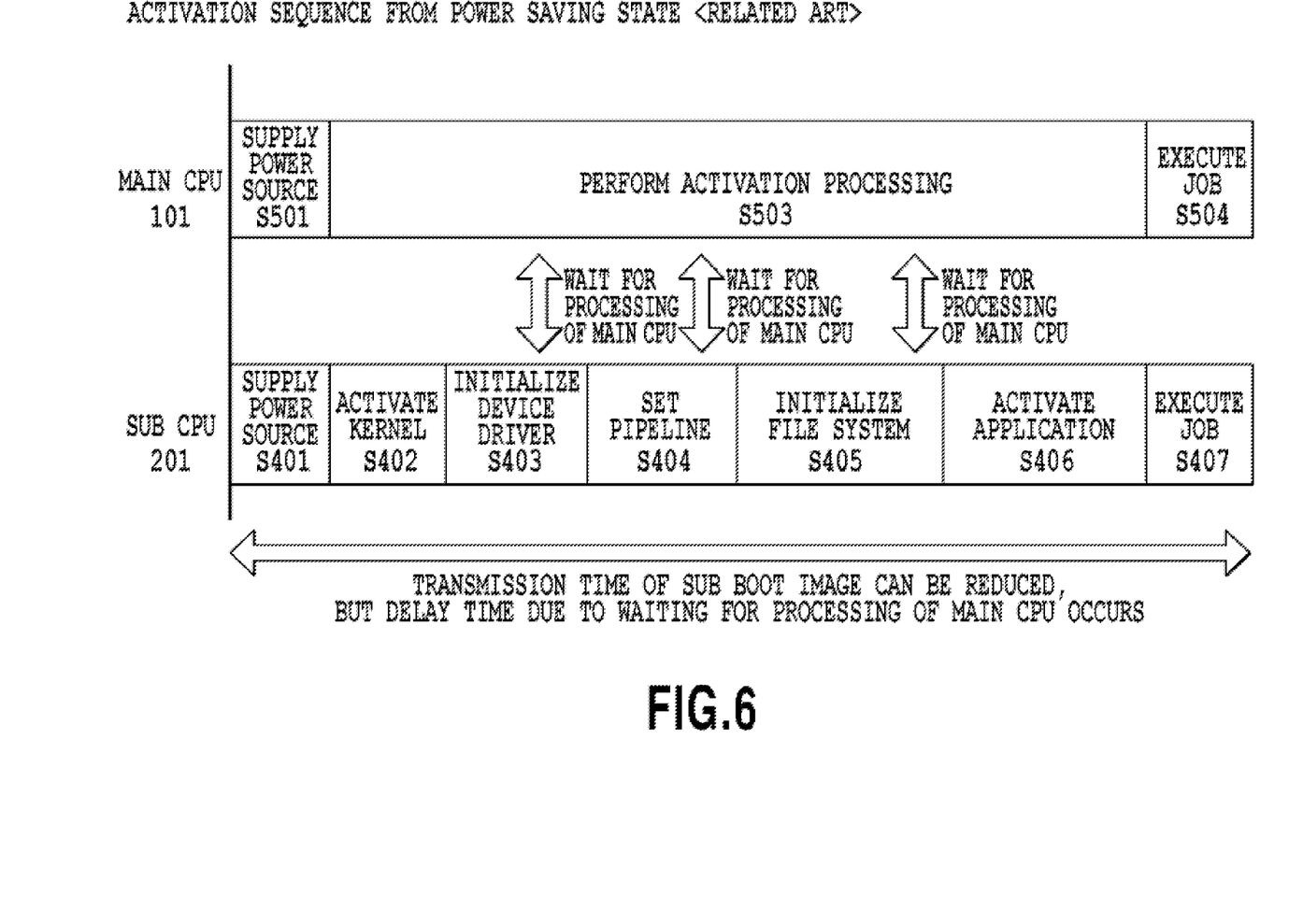
FIG. 6 is a timing chart illustrating an activation sequence in which an MFP according to the related art is activated from a power saving state.

FIG. 6 is a timing chart illustrating an activation sequence in which the MFP 1 to which the related art of Japanese Patent Laid-Open No. 2016-051925 is applied, is activated tram the power saving state.

The MFP 1 of the related develops the sub boot image in the RAM 202 of the sub substrate 200 in advance at the time of being transitioned to the power saving state from the normal power state, and allows the RAM 202 to proceed to a self-refresh mode. Further, the MFP 1 of the related art is activated from the power saving state, the MFP 1 cancels the self-refresh mode of the RAM 202, and allows the sub CPU 201 to execute the activation processing (S401 to S406) of the sub substrate 200. Furthermore, in general, the self-refresh is a mechanism in which a refresh circuit (a timer and a counter) is built in the RAM, and thus, the refresh processing of the RAM can be automatically executed. The RAM which has proceeded to the self-refresh mode may hold the data at low consumption power, and thus, it is possible to suppress the power consumption of the entire MFP 1.

According to the related art, it is not necessary for the main CPU 101 to transmit the sub boot image to the RAM 202 of the sub substrate 200. For this reason, the main CPU 101 and the sub CPU 201 may start the activation processing (S503, and S402 to S406), respectively, immediately after the power source is supplied (S501 and S401).

However, as illustrated in the timing chart of FIG. 6, in the activation of the MFP in the related art, the negotiation is performed between the sub CPU 201 and the main CPU 101. For this reason, in the activation processing of the sub CPU 201, there is a case where delay due to waiting for the processing of the main CPU 101 still occurs. In particular, in a case where waiting time of the spinup time of the HDD 6 occurs, it is difficult to shorten activation time from the supply of the power source to the sub substrate 200 (S401) to the completion of the activation of the FAX device 7 (S406) as the waiting time is long.

Figure 7A:
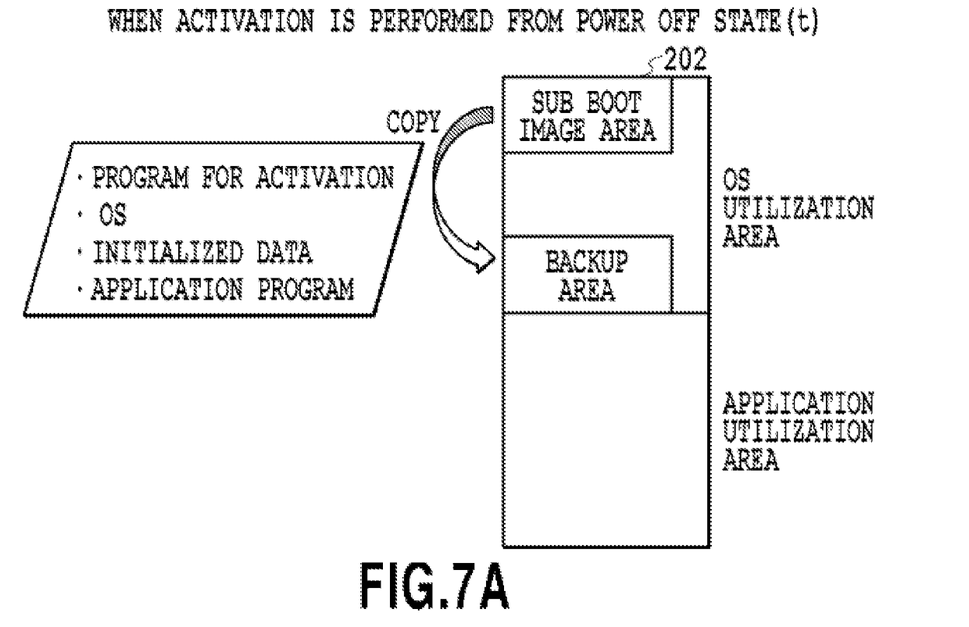
FIG. 7A is a schematic view illustrating processing to be executed in a case where the MFP is activated from the power off state.
Figure 7B:
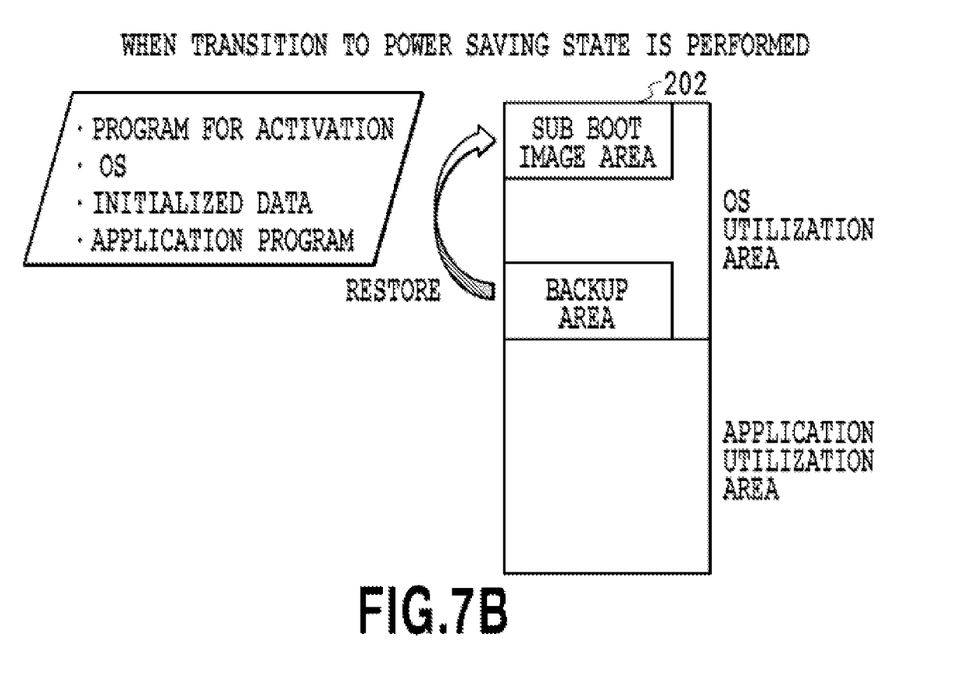
FIG. 7B is a schematic view illustrating processing to be executed in a case where the MFP is transitioned to a power saving state.

FIG. 7A and FIG. 7B are schematic views of a memory map of the RAM 202 according to present embodiment. The RAM 202 of present embodiment includes an OS utilization area in which the OS is used, and an application utilization area in which the application is used. The sub CPU 201 may write various data items in the RAM 202 and may read out various data items from the RAM 202, as necessary. Thus, the RAM 202 corresponds to the storage unit of the sub system.

Hereinafter, processing which is executed by the sub CPU 201 when the MFP 1 is activated from the power off state will be described with reference to the memory map of FIG. 7A. FIG. 7A is a diagram schematically illustrating processing in which the program for activation, the OS, the initialized data, and the application program, which are developed from the sub boot image, are copied in a backup area, which is a space area in the OS utilization area. The sub CPU 201 temporarily suspends the activation processing of the sub substrate 200 at a timing immediately before the application activation (S406) (in FIG. 5, a timing represented by ("t"), when the MFP 1 is activated from the power off state. Next, the sub CPU 201 acquires a snapshot of a sub boot image area, and saves the acquired snapshot in the backup area. The data group copied in the backup area includes not only the initialized device driver or the like, for example, but also the information or the like required for the application activation, and information required to be acquired from the main CPU 101 in the activation processing of the sub CPU 201. Furthermore, in the present embodiment, the data group which is developed in the sub boot image area is copied in the backup area before the application operated in the sub CPU 201 is activated. However, the timing when the sub CPU 201 executes copying is not limited to the above description, and may be a timing after the negotiation executed between the main CPU 101 and the sub CPU 201 is ended.

Next, processing which is executed by the sub CPU 201 when the MFP 1 is transitioned to the power saving state from the normal power state will be described with reference to the memory map of FIG. 7B. FIG. 7B is a diagram schematically illustrating processing in which the program for activation, the OS, the initialized data, and the application program, which are copied in the backup area, are restored again to the sub boot image area in the OS utilization area. The sub CPU 201 restores the data group to the sub boot image area from the backup area when the MFP 1 is transitioned to the power saving state from the normal power state. The sub CPU 201 writes a flag representing that the MFP 1 is activated from the power saving state in each of the RAM 103 of the main substrate 100 and the RAM 202 of the sub substrate 200, and sets the RAM 202 to be in the self-refresh mode, after the data group is restored. The data group which is restored to the sub boot image area while the RAM 202 is set to be in the self-refresh mode, is held in the sub boot image area. After that, the supply of the power source to the controller 3 is suspended, and the MFP 1 is transitioned to the power saving state.

Figure 8A:
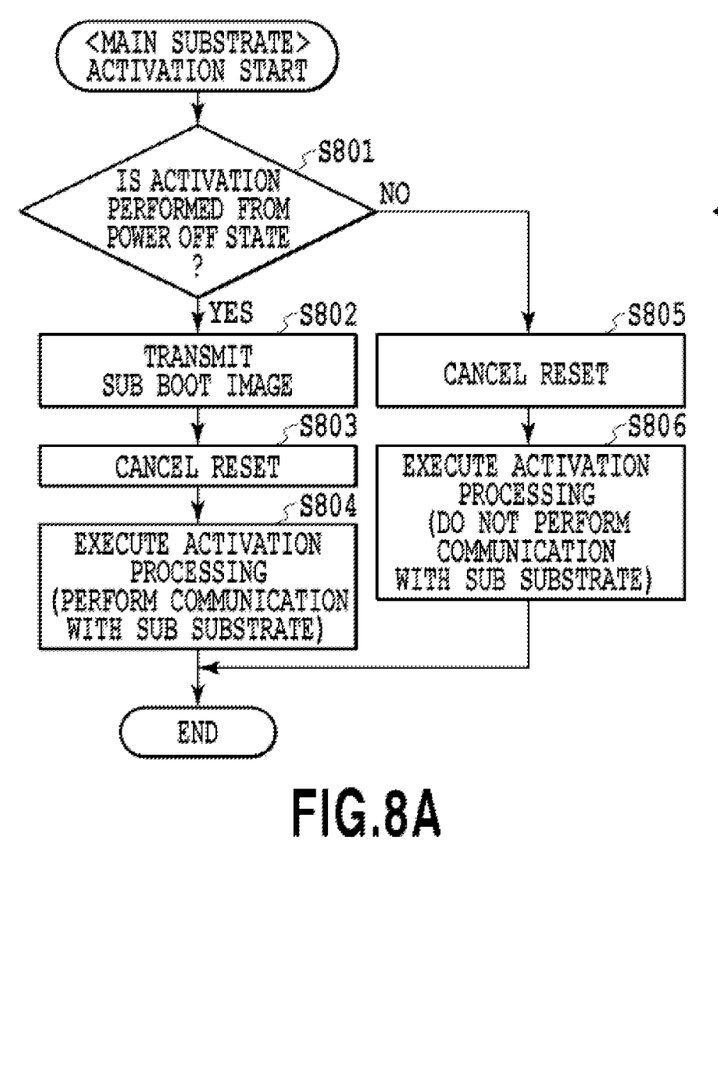
FIG. 8A is a flowchart illustrating a procedure of activation processing of a main substrate.
Figure 8B:
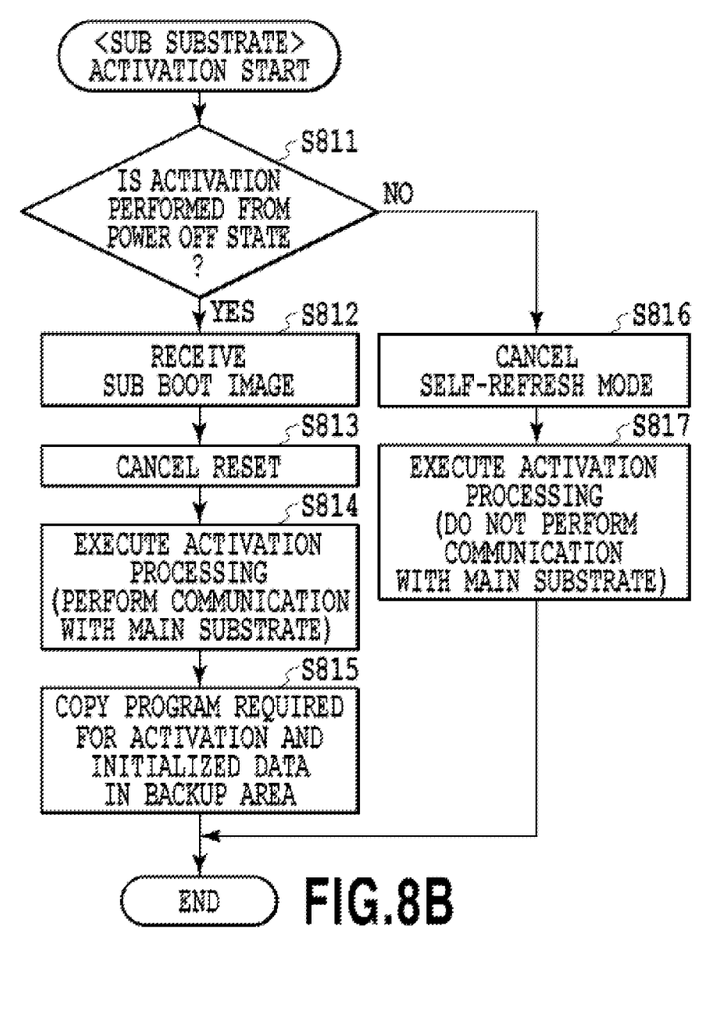
FIG. 8B is a flowchart illustrating a procedure of activation processing of a sub substrate.

FIG. 8A and FIG. 8B are flowcharts illustrating the procedure of the activation processing of the main substrate 100 and the sub substrate 200 in the present embodiment. In the processing according to the flowchart illustrated in FIG. 6A and FIG. 8B, the program code stored in the storage area of the main substrate 100 and the sub substrata 200 is developed in the RAM, and is executed by each of the main CPU 101 and the sub CPU 201.

First, the procedure of the activation processing of the main substrate 100 will be described with reference to the flowchart of FIG. 8A. In S801, the main CPU 101 determines whether the MFP 1 is activated from the power off state or the MFP 1 is activated from the power saving state with reference to the flag recorded in the RAM 103.

In a case where the MFP 1 is activated from the power off state (S801: YES), the MFP 1 is activated in the activation sequence of FIG. 5. That is, the sub boot image is transmitted to the RAM 202 (S802), and the reset of the sub CPU 201 is cancelled (S803). Next, in S804, the main CPU 101 executes the activation processing of the main substrate 100 by using the program for activation and various data items while performing the negotiation with the sub CPU 201 at a suitable timing.

On the other hand, in a case where the MFP 1 is activated from the power saving state (S801: NO), the reset of the sub CPU 201 is cancelled (S805). Next, in S806, the main CPU 101 executes the activation processing of the main substrate 100 by using the program for activation and various data items without performing the negotiation with the sub CPU 201. That is, in a case where the MFP 1 of present embodiment is activated from the power saving state, a step of performing the negotiation with the sub substrate 200 is reduced in addition to a step of transmitting the sub boot image. In a case where the processing of S804 and S806 is ended, the processing according to this flowchart is ended.

Next, the procedure of the activation processing of the sub substrate 200 will be described with reference to the flowchart of FIG. 8B. In S811, the sub CPU 201 determines whether the MFP 1 is activated from the power off state or the MFP 1 is activated from the power saving stats with reference to the flag recorded in the RAH 202.

In a case where the MFP 1 is activated from the power off state (S811: YES), the MFP 1 is activated in the activation sequence of FIG. 5. That is, the sub boot image is transmitted to the RAM 202 (S812), and the reset of the sub CPU 201 is cancelled (S813). Next, in S814, the sub CPU 201 executes the activation processing of the sub substrate 200 by using the activation program and various data items which are developed from the sub boot image, while performing the negotiation with the main CPU 101 at a suitable timing. In S815, the sub CPU 201 copies the program for activation, the OS, the initialized data, and the application program in the backup area of the RAM 202 at a timing immediately before the application activation (S406).

On the other hand, in a case where the MFP 1 is activated from the power saving state (S811: NO), in S816, the sub CPU 201 cancels the self-refresh mode of the RAM 202. In S817, the sub CPU 201 executes the activation processing of the sub substrate 200 by using the program for activation and various data items without performing the negotiation with the main CPU 101. In a case where the processing of S815 and S818 is ended, the processing according to this flowchart is ended.

Figure 9:
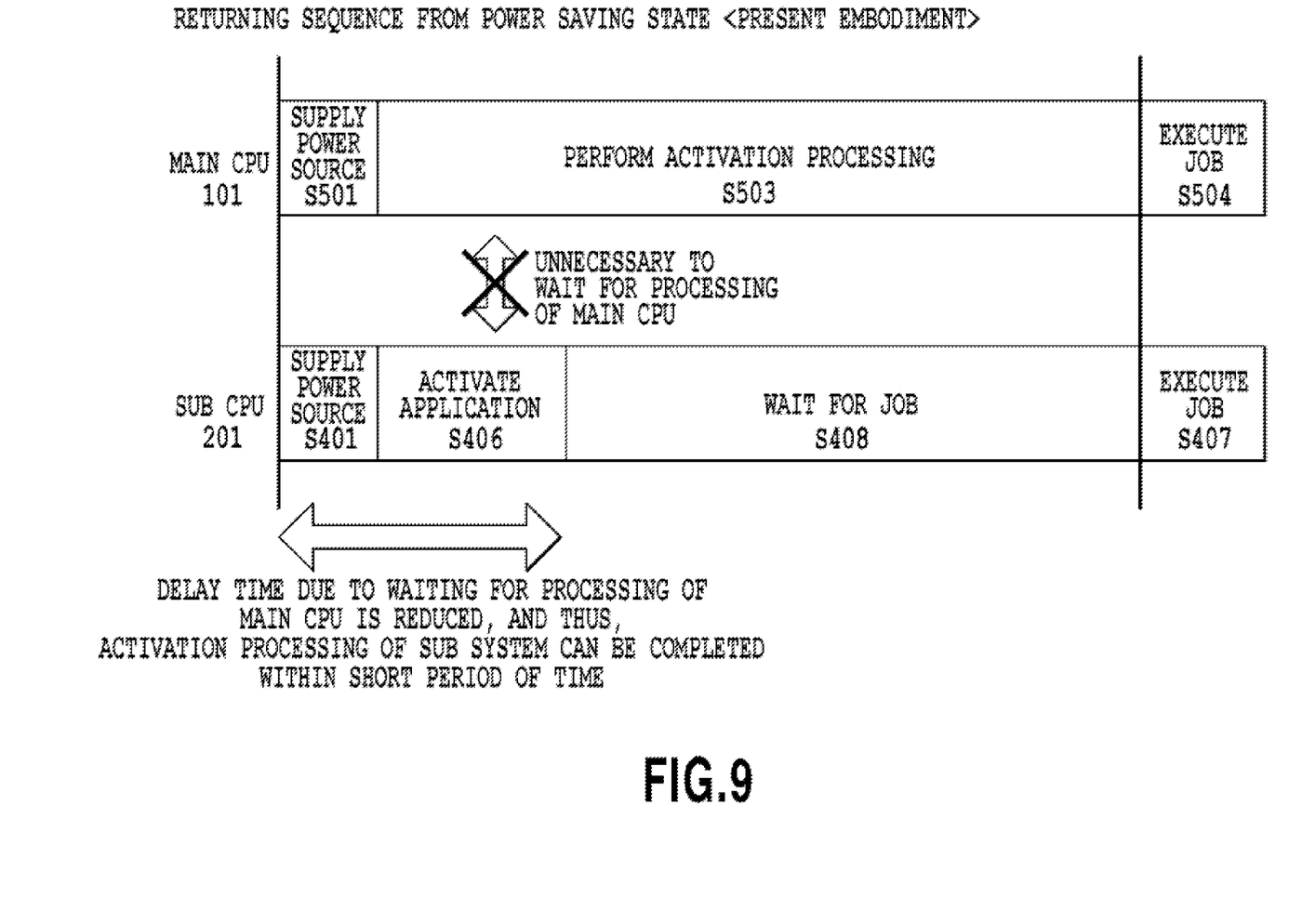
FIG. 9 is a timing chart illustrating an activation sequence in which the MFP according to present embodiment is activated from the power saving state.

FIG. 9 is a timing chart illustrating an activation sequence in which the MFP 1 is activated from the power saving state in the present embodiment. In the present embodiment, in a case where the MFP 1 is activated from the power saving state, the program for activation, the OS, the initialized data, and the application program, which are restored to the sub boot image area of the RAM 202 in advance, are used. For this reason, in the activation processing of the sub substrate 200, a step of performing the negotiation between the main substrate 100 and the sub substrate 200 is reduced in addition to the step of transmitting the sub boot image. According to such a configuration, the sub CPU 201 of present embodiment may start the application activation (S406) immediately after the supply of the power source to the sub substrate 200 (S401) is completed.

In a case where the application activation (S406) is completed, the sub system (the sub substrate 200 and the sub device) is transitioned to a state in which a response to the received job is can be performed, until the activation processing (S503) of the resin substrate 100 is completed (S408). For example, in a case where the activation of the application for controlling the FAX device 7 is completed, the FAX device 7 is transitioned to a state in which the response to the incoming FAX from the other FAX device which is connected to the FAX device 7 through a telephone line. Thus, in the MFP 1 of present embodiment, for example, the sub system including the FAX device 7 may complete the activation to the normal power state from the power saving state within a short period of time, and may respond to a job within a time limit required for the standard.

As described above, in the MFP 1 of present embodiment, the responsiveness of the sub device is improved by shortening time required for the activation processing of the sub system while power saving properties are improved by suppressing the supply of the power source to the sub system, during the operation of the MFP 1 in the power saving state.

Other Embodiments

Embodiment(s) of the present invention can also be realized by a computer of a system or apparatus that reads out end executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card. and the like.

According to the invention, it is possible to improve responsiveness in an information processing apparatus including a main system and a sub system.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-219733, filed Nov. 10, 2016, which is hereby incorporated by reference wherein in its entirety.

What is claimed is:

1. An information processing apparatus comprising:
a main system; and
a sub system including a processor which executes activation processing of the sub system on the basis of a boot image transmitted from the main system,
wherein the sub system is configured:
to start the activation processing of the sub system by using the boot image which has been transferred from the main system, in activation from a power-off state of the information processing apparatus;
to store, into a second area in a storage device of the sub system, an activation program and an OS for the sub system derived from the boot image and a device driver having been initialized in the activation processing that are in a first area in the storage device in the sub system before the activation processing in the activation from the power-off state of the information processing apparatus is ended;
to restore, into the first area in the storage device in the sub system, the activation program and OS for the sub system and the initialized device driver that are in the second area in the storage device in the sub system due to the storing, in transition to a power saving state of the information processing apparatus;
to continue holding the activation program, the OS and the initialized device driver that have been restored in the first area in the storage device in the sub system at least while the information processing apparatus is in the power saving state.

2. The information processing apparatus according to claim 1, wherein
in the storing, the sub system stores, in the second area of the storage device, an activation program for an application and data used for activation of the application from the first area of the storage device.

3. The information processing apparatus according to claim 1, wherein
in the storing, the sub system stores, in the second area of the storage device, data derived by the activation processing of the sub system executed before the activation of the application, the data being from the first area of the storage device.

4. The information processing apparatus according to claim 3, wherein
the sub system does not store, in the second area of the storage device, data derived after start of activation of the application, the data being from the first area of the storage device.

5. A method for controlling an information processing apparatus having a main system and a sub system including a processor which executes activation processing of the sub system on the basis of a boot image transmitted from the main system, the method comprising:
starting the activation processing of the sub system by using the boot image which has been transferred from the main system, in activation from a power-off state of the information processing apparatus;
storing, into a second area in a storage device of the sub system, an activation program and an OS for the sub system derived from the boot image and a device driver having been initialized in the activation processing that are in a first area in the storage device in the sub system before the activation processing in the activation from the power-off state of the information processing apparatus is ended;
restoring, into the first area in the storage device in the sub system, the activation program and OS for the sub system and the initialized device driver that are in the second area in the storage device in the sub system due to the storing, in transition to a power saving state of the information processing apparatus; and
continue holding the activation program, the OS and the initialized device driver that have been restored in the first area in the storage device in the sub system at least while the information processing apparatus is in the power saving state.

6. The method according to claim 5, wherein
in the storing, the sub system stores, in the second area of the storage device, an activation program for an application and data used for activation of the application from the first area of the storage device.

7. The method according to claim 5, wherein
in the storing, the sub system stores, in the second area of the storage device, data derived by the activation processing of the sub system executed before the activation of the application, the data being from the first area of the storage device.

8. The method according to claim 7, wherein
the sub system does not store, in the second area of the storage device, data derived after start of activation of the application, the data being from the first area of the storage device.

* * * * *